United States Patent
Uesugi et al.

(10) Patent No.: US 10,629,724 B2
(45) Date of Patent: Apr. 21, 2020

(54) SEMICONDUCTOR DEVICE AND METHOD FOR MANUFACTURING THE SAME

(71) Applicant: Kabushiki Kaisha Toshiba, Minato-ku (JP)

(72) Inventors: Kenjiro Uesugi, Kawasaki (JP); Shigeya Kimura, Yokohama (JP); Masahiko Kuraguchi, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/901,006

(22) Filed: Feb. 21, 2018

(65) Prior Publication Data

US 2018/0358462 A1 Dec. 13, 2018

(30) Foreign Application Priority Data

Jun. 9, 2017 (JP) ................. 2017-114292

(51) Int. Cl.
*H01L 29/78* (2006.01)
*H01L 29/205* (2006.01)
(Continued)

(52) U.S. Cl.
CPC ...... *H01L 29/7813* (2013.01); *H01L 29/0865* (2013.01); *H01L 29/1037* (2013.01);
(Continued)

(58) Field of Classification Search
None
See application file for complete search history.

(56) References Cited

U.S. PATENT DOCUMENTS 9,166,030 B2    10/2015  Imada
2007/0114567 A1*  5/2007  Matocha ........... H01L 29/42316
                                                              257/192
(Continued)

FOREIGN PATENT DOCUMENTS

JP    2008-108844 A    5/2005
JP    2008-258514      10/2008
(Continued)

OTHER PUBLICATIONS

Tohru Oka, et al., "1.8 mΩ·cm² vertical GaN-based trench metal-oxide-semiconductor field-effect transistors on a free-standing GaN substrate for 1.2-kV-class operation," Applied Physics Express 8, 2015, pp. 054101-1 to 054101-3.
(Continued)

*Primary Examiner* — Davienne N Monbleau
*Assistant Examiner* — Scott R Wilson
(74) *Attorney, Agent, or Firm* — Oblon, McClelland, Maier & Neustadt, L.L.P.

(57) ABSTRACT

According to one embodiment, a semiconductor device includes first, second and third electrodes, first, second, third, and fourth semiconductor regions, and an insulating portion. The first electrode includes first and second electrode portions. The first semiconductor region includes first, second, and third semiconductor portions. The first semiconductor portion is provided between the first electrode portion and the second electrode. The second semiconductor portion is provided between the second electrode portion and the third electrode. The third semiconductor portion is
(Continued)

provided between the first and second semiconductor portions. The second semiconductor region is provided between the first semiconductor portion and the second electrode. The third semiconductor region is positioned between the second semiconductor region and the third electrode. The insulating portion includes first and second insulating regions. At least a portion of the fourth semiconductor region is provided between the second semiconductor region and the second electrode.

20 Claims, 6 Drawing Sheets

(51) Int. Cl.
  *H01L 29/10* (2006.01)
  *H01L 29/66* (2006.01)
  *H01L 29/08* (2006.01)
  *H01L 29/778* (2006.01)
  *H01L 29/423* (2006.01)
  *H01L 29/20* (2006.01)
  *H01L 29/06* (2006.01)
  *H01L 29/04* (2006.01)

(52) U.S. Cl.
  CPC ........ *H01L 29/1054* (2013.01); *H01L 29/205* (2013.01); *H01L 29/4236* (2013.01); *H01L 29/66462* (2013.01); *H01L 29/66522* (2013.01); *H01L 29/66734* (2013.01); *H01L 29/7788* (2013.01); *H01L 29/7789* (2013.01); *H01L 29/045* (2013.01); *H01L 29/0696* (2013.01); *H01L 29/2003* (2013.01)

(56) References Cited

U.S. PATENT DOCUMENTS

| | | |
|---|---|---|
| 2008/0105954 A1* | 5/2008 | Kodama ........... H01L 21/32134 257/623 |
| 2010/0117119 A1 | 5/2010 | Uesugi et al. |
| 2013/0168739 A1* | 7/2013 | Kiyama ............ H01L 29/66462 257/194 |
| 2015/0014700 A1 | 1/2015 | Khalil et al. |
| 2015/0060943 A1* | 3/2015 | Motonobu ........ H01L 29/66666 257/192 |
| 2015/0069405 A1 | 3/2015 | Yoshioka et al. |
| 2017/0025518 A1 | 1/2017 | Khalil et al. |
| 2017/0125574 A1* | 5/2017 | Chowdhury ........ H01L 29/7787 |

FOREIGN PATENT DOCUMENTS

| | | |
|---|---|---|
| JP | 2011-124509 | 6/2011 |
| JP | 2014-22701 A | 2/2014 |
| JP | 2015-056486 | 3/2015 |
| JP | 2015-99903 A | 5/2015 |
| WO | WO 2011/114535 | 9/2011 |

OTHER PUBLICATIONS

Masaya Okada, et al., "Development of Vertical Heterojunction Field-Effect Transistors on Low Dislocation Density GaN Substrates," 11 Pages (with English Abstract and Computer Generated English Translation).

Tohru Oka, et al., "Vertical GaN-based trench metal oxide semiconductor filed-effect transistors on a free-standing GaN substrate with blocking voltage of 1.6 kV," Applied Physics Express 7, 2014, pp. 021002-1 to 021002-3.

* cited by examiner

ZSEMICONDUCTOR DEVICE AND METHOD
FOR MANUFACTURING THE SAME

CROSS-REFERENCE TO RELATED
APPLICATIONS

This application is based upon and claims the benefit of priority from Japanese Patent Application No. 2017-114292, filed on Jun. 9, 2017; the entire contents of which are incorporated herein by reference.

FIELD

Embodiments described herein relate generally to a semiconductor device and a method for manufacturing the same.

BACKGROUND

For example, there are semiconductor devices such as transistors, etc. It is desirable to reduce the on-resistance of the semiconductor devices.

DETAILED DESCRIPTION

Figure 1:
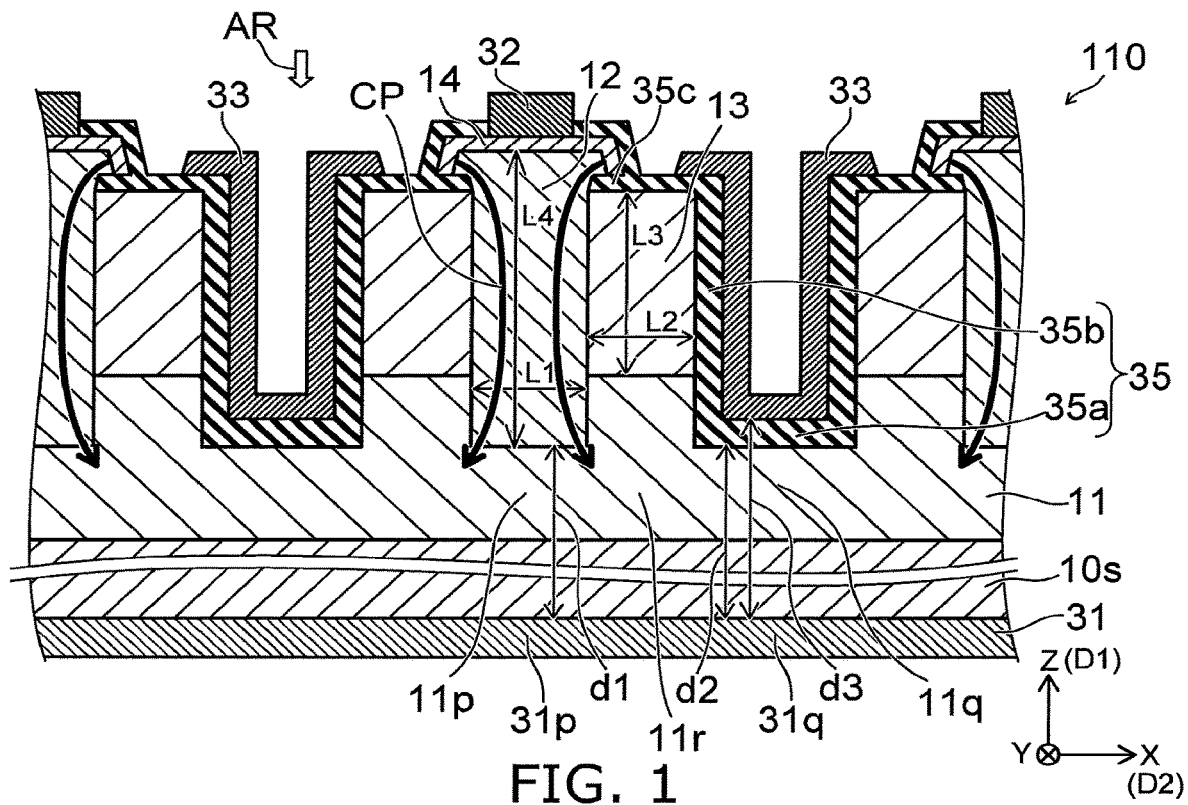
FIG. 1 is a schematic cross-sectional view illustrating a semiconductor device according to a first embodiment.

According to one embodiment, a semiconductor device includes first, second and third electrodes, first, second, third, and fourth semiconductor regions, and an insulating portion. The first electrode includes a first electrode portion and a second electrode portion. A first direction from the first electrode portion toward the second electrode crosses a second direction from the first electrode portion toward the second electrode portion. A direction from the second electrode portion toward the third electrode is along the first direction. The first semiconductor region includes a first semiconductor portion, a second semiconductor portion, and a third semiconductor portion. The first semiconductor portion is provided between the first electrode portion and the second electrode in the first direction. The second semiconductor portion is provided between the second electrode portion and the third electrode in the first direction. The third semiconductor portion is provided between the first semiconductor portion and the second semiconductor portion in the second direction. The first semiconductor region includes $Al_{x1}Ga_{1-x1}N$ ($0 \le x1 < 1$). The first semiconductor region includes a first impurity of a first conductivity type at a first concentration. The second semiconductor region includes $Al_{x2}Ga_{1-x2}N$ ($0 \le x2 < 1$) and is provided between the first semiconductor portion and the second electrode in the first direction. The second semiconductor region does not include the first impurity, or a second concentration of the first impurity in the second semiconductor region is lower than the first concentration. The third semiconductor region includes $Al_{x3}Ga_{1-x3}N$ ($0 < x3 < 1$, $x1 < x3$, and $x2 < x3$). A direction from the third semiconductor portion toward the third semiconductor region is aligned with the first direction. The third semiconductor region is positioned between the second semiconductor region and the third electrode in the second direction. The insulating portion includes a first insulating region and a second insulating region. The first insulating region is positioned between the second semiconductor portion and the third electrode in the first direction. The second insulating region is positioned between the third semiconductor region and the third electrode in the second direction. At least a portion of the fourth semiconductor region is provided between the second semiconductor region and the second electrode. The fourth semiconductor region includes $Al_{x4}Ga_{1-x4}N$ ($0 \le x4 < 1$). A fourth concentration of the first impurity in the fourth semiconductor region is higher than the second concentration.

According to another embodiment, a method for manufacturing a semiconductor device is disclosed. The method can include preparing a stacked body including a first semiconductor film and a third semiconductor film. The third semiconductor film is provided on the first semiconductor film. The first semiconductor film includes $Al_{x1}Ga_{1-x1}N$ ($0 \le x1 < 1$), the third semiconductor film includes $Al_{x3}Ga_{1-x3}N$ ($0 < x3 < 1$ and $x1 < x3$), and the first semiconductor film includes a first concentration of a first impurity of a first conductivity type. The method can include forming a first semiconductor region from the first semiconductor film and forming a third semiconductor region from the third semiconductor film by forming a first hole and a second hole reaching the first semiconductor film from an upper surface of the third semiconductor film. The method can include forming a first insulating film on a bottom surface and a side surface of the first hole. The method can include forming a second semiconductor region in the second hole. The second semiconductor region includes $Al_{x2}Ga_{1-x2}N$ ($0 \le x2 < 1$ and $x2 < x3$). The second semiconductor region does not include an impurity, or a second concentration of the first impurity in the second semiconductor region is lower than the first concentration. The method can include forming a fourth semiconductor region on the second semiconductor region. The fourth semiconductor region includes $Al_{x4}Ga_{1-x4}N$ ($0 \le x4 < 1$). A fourth concentration of the first impurity in the fourth semiconductor region is higher than the second concentration. In addition, the method can include forming a second electrode, a third electrode, and a first electrode. The second electrode is electrically connected to the fourth semiconductor region, the third electrode is provided in a remaining space of the first hole, and the first electrode is electrically connected to the first semiconductor region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 2:
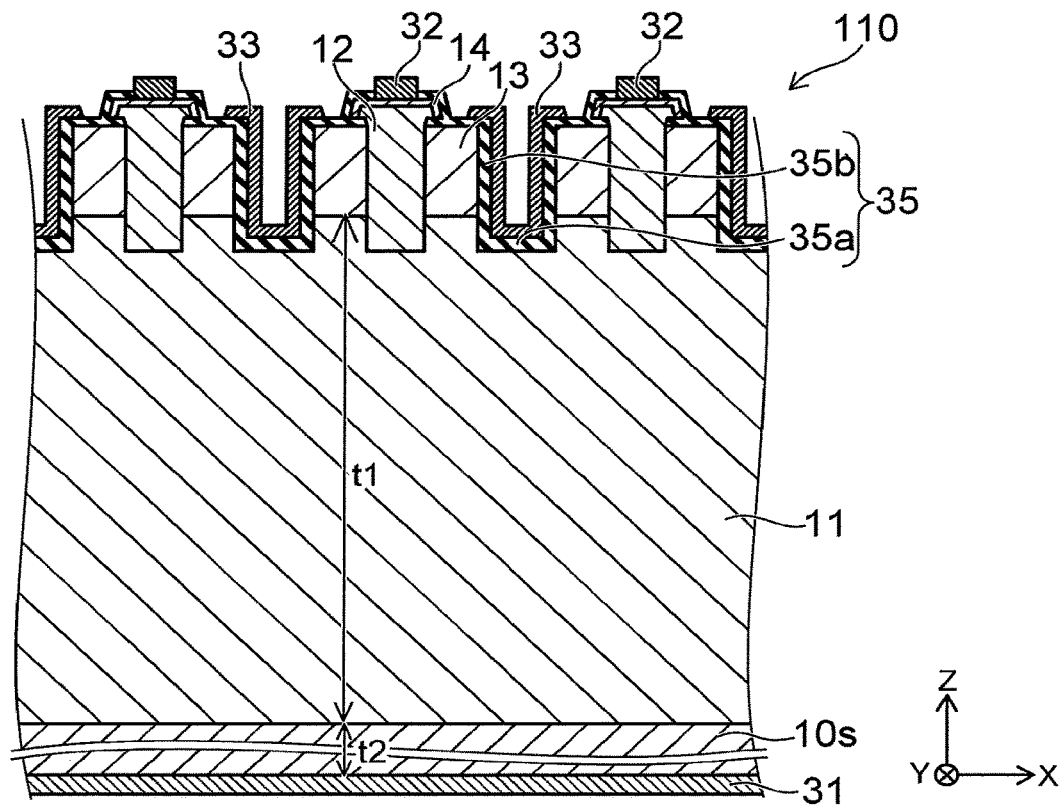
FIG. 2 is a schematic cross-sectional view illustrating a semiconductor device according to the first embodiment.

FIG. 1 and FIG. 2 are schematic cross-sectional views illustrating a semiconductor device according to a first embodiment.

As shown in FIG. 1, the semiconductor device 110 according to the first embodiment includes first to third electrodes 31 to 33, first to fourth semiconductor regions 11 to 14, and an insulating portion 35.

The first electrode 31 includes a first electrode portion 31p and a second electrode portion 31q. The first electrode portion 31p is continuous with the second electrode portion 31q. The first electrode portion 31p is one region of the first electrode 31. The second electrode portion 31q is another one region of the first electrode 31.

The second electrode 32 is separated from the first electrode portion 31p in the first direction. The direction from the first electrode portion 31p toward the second electrode 32 is taken as a first direction D1.

The first direction D1 is taken as a Z-axis direction. One direction perpendicular to the Z-axis direction is taken as an X-axis direction. A direction perpendicular to the Z-axis direction and the X-axis direction is taken as a Y-axis direction.

The direction from the first electrode portion 31p toward the second electrode portion 31q is taken as a second direction D2. The first direction D1 recited above crosses the second direction D2. In the example, the second direction D2 is the X-axis direction.

The third electrode 33 is separated from the second electrode portion 31q along the first direction D1. The direction from the second electrode portion 31q toward the third electrode 33 is aligned with the first direction D.

The first semiconductor region 11 includes a first semiconductor portion 11p, a second semiconductor portion 11q, and a third semiconductor portion 11r. These semiconductor portions are continuous with each other. The first semiconductor portion 11p is one region of the first semiconductor region 11. The second semiconductor portion 11q is another one region of the first semiconductor region 11. The third semiconductor portion 11r is yet another one region of the first semiconductor region 11.

The first semiconductor portion 11p is provided between the first electrode portion 31p and the second electrode 32 in the first direction D1. The second semiconductor portion 11q is provided between the second electrode portion 31q and the third electrode 33 in the first direction D1. The third semiconductor portion 11r is provided between the first semiconductor portion 11p and the second semiconductor portion 11q in the second direction D2.

The first semiconductor region 11 includes $Al_{x1}Ga_{1-x1}N$ ($0 \leq x1 < 1$). The first semiconductor region 11 includes a first impurity of a first conductivity type at a first concentration. The first conductivity type is, for example, an n-type. The first impurity of the n-type includes, for example, at least one selected from the group consisting of Si, Ge, and Sn. The first semiconductor region 11 is, for example, an n⁻-GaN region.

The second semiconductor region 12 is provided between the first semiconductor portion 11p and the second electrode 32 in the first direction D1. The second semiconductor region 12 includes $Al_{x2}Ga_{1-x2}N$ ($0 \leq x2 < 1$). The second semiconductor region 12 does not include the first impurity. Or, a second concentration of the first impurity in the second semiconductor region 12 is lower than the first concentration. The impurity concentration of the second semiconductor region 12 is, for example, $2 \times 10^{16}$ cm$^{-3}$ or less. The second semiconductor region 12 is, for example, an i-GaN region.

The direction from the third semiconductor portion 11r toward the third semiconductor region 13 is aligned with the first direction D1. The third semiconductor region 13 is positioned between the second semiconductor region 12 and the third electrode 33 in the second direction D2. The third semiconductor region 13 includes $Al_{x3}Ga_{1-x3}N$ ($0 < x3 < 1$, $x1 < x3$, and $x2 < x3$). The third semiconductor region 13 is, for example, an AlGaN region.

The insulating portion 35 includes a first insulating region 35a and a second insulating region 35b. The first insulating region 35a is positioned between the second semiconductor portion 11q and the third electrode 33 in the first direction D1. The second insulating region 35b is positioned between the third semiconductor region 13 and the third electrode 33 in the second direction D2. The first insulating region 35a is continuous with the second insulating region 35b. The first insulating region 35a contacts the second semiconductor portion 11q.

For example, at least a portion of the fourth semiconductor region 14 is provided between the second semiconductor region 12 and the second electrode 32. For example, a portion of the fourth semiconductor region 14 is provided between the second semiconductor region 12 and the second electrode 32 in the first direction D1. The fourth semiconductor region 14 includes $Al_{x4}Ga_{1-x4}N$ ($0 \leq x4 < 1$). A fourth concentration of the first impurity in the fourth semiconductor region 14 is higher than the second concentration of the first impurity in the second semiconductor region 12. The fourth semiconductor region 14 is, for example, an n-type GaN region. The fourth concentration of the first impurity in the fourth semiconductor region 14 may be higher than the first concentration of the first impurity in the first semiconductor region 11. The fourth semiconductor region 14 is, for example, n⁺-GaN.

A base body 10s is further provided in the example. The base body 10s is, for example, a substrate. The base body 10s is, for example, an n⁺-GaN substrate. The base body 10s is provided between the first electrode 31 and the first semiconductor region 11 in the first direction D1.

The first electrode 31 functions as, for example, a drain electrode. The second electrode 32 functions as, for example, a source electrode. The third electrode 33 functions as, for example, a gate electrode. The insulating portion functions as a gate insulating film. The fourth semiconductor region 14 functions as a contact region (e.g., an ohmic contact region). The semiconductor device 110 is, for example, a transistor. For example, a normally-off operation is performed in the semiconductor device 110.

In the semiconductor device 110 as described below, a current flows between the first electrode 31 and the second electrode 32 when a voltage that is higher than a threshold is applied to the third electrode 33. The second semiconductor region 12 includes a portion (an interface portion) at the vicinity of the third semiconductor region 13. The current passes through the interface portion of the second semiconductor region 12 and flows in the first semiconductor portion 11p of the first semiconductor region 11. A channel CP (a current path) includes, for example, the interface portion of the second semiconductor region 12 recited above.

In the semiconductor device 110 according to the embodiment, a high mobility is obtained because the current flows through the interface portion of the second semiconductor region 12. Thereby, an on-resistance RonA can be reduced.

For example, there is a first reference example in which the current flows not in the interface portion but through the bulk portion of the semiconductor region. In the first reference example, the on-resistance becomes high in the case where the element is downscaled (e.g., the distance between the source electrode and the gate electrode is reduced).

Conversely, in the embodiment, the current flows through the interface portion of the second semiconductor region 12. Therefore, the increase of the on-resistance when the element is downscaled can be suppressed.

In the embodiment, the interface between the second semiconductor region 12 and the third semiconductor region 13 extends along the first direction D1. At least a portion of the channel CP is aligned with the interface. For example, the energy band of the second semiconductor region 12 (GaN corresponding to the channel) increases due to the polarization of the third semiconductor region 13 (AlGaN). For example, a back barrier effect is obtained. For example, a small off-current is obtained. Thereby, a good normally-off characteristic is obtained.

On the other hand, there is a second reference example in which the second semiconductor region 12 includes an impurity of a second conductivity type (a p-type) (e.g., Mg, etc.). In the second reference example, the normally-off operation is obtained by the p-type impurity region. In the second reference example, there are cases where the crystallinity of the second semiconductor region 12 decreases due to the impurity of the second conductivity type. For example, there are also cases where the impurity of the second conductivity type scatters the electrons. Therefore, for example, the on-resistance increases easily.

Conversely, in the embodiment, a high off-resistance can be maintained even in the case where the second semiconductor region 12 substantially does not include an impurity of the second conductivity type (the p-type). A good normally-off characteristic is obtained.

In the example as shown in FIG. 1, the insulating portion 35 further includes a third insulating region 35c. The third insulating region 35c is positioned between the fourth semiconductor region 14 and the third semiconductor region 13 in the first direction D1. The path of the current is controlled appropriately by the third insulating region 35c.

As shown in FIG. 1, the direction from a portion of the fourth semiconductor region 14 toward the second semiconductor region 12 may be aligned with the second direction D2.

As shown in FIG. 1, a portion (e.g., the third semiconductor portion 11r) of the first semiconductor region 11 is positioned between the second semiconductor region 12 and the third electrode 33 in the second direction D2. For example, the bottom portion of the third semiconductor region 13 is positioned higher than the bottom portion of the second semiconductor region 12 and positioned higher than the bottom portion of the third electrode 33.

In one example of a method for manufacturing the semiconductor device 110 according to the embodiment as described below, a hole (trench) in which the second semiconductor region 12 is provided and a hole (trench) in which the third electrode 33 (and the insulating portion 35) are provided are formed simultaneously. In such a case, the depths of these holes are the same.

For example, the distance along the first direction D1 between the first electrode portion 31p and the second semiconductor region 12 is taken as a first distance d1. The distance along the first direction D1 between the second electrode portion 31q and the first insulating region 35a is taken as a second distance d2. The ratio of the absolute value of the difference between the first distance d1 and the second distance d2 to the first distance d1 is 0.05 or less. The ratio may be, for example, 0.03 or less.

On the other hand, the distance along the first direction D1 between the second electrode portion 31q and the third electrode 33 is taken as a third distance d3. The first distance dl is shorter than the third distance d3. The difference between the first distance dl and the third distance d3 is substantially the same as the thickness along the first direction D1 of the first insulating region 35a. For example, the difference between the first distance dl and the third distance d3 is not less than 0.9 times and not more than 1.1 times the thickness along the first direction D1 of the first insulating region 35a.

In the embodiment as described below, it is favorable for a length L1 along the second direction D2 of the second semiconductor region 12 to be, for example, 500 nm or more.

It is favorable for a length L4 along the first direction D1 of the second semiconductor region 12 to be, for example, not less than 1000 nm and not more than 5000 nm.

It is favorable for a length L2 along the second direction D2 of the third semiconductor region 13 to be, for example, 1000 nm or less.

It is favorable for a length L3 along the first direction D1 of the third semiconductor region 13 to be, for example, not less than 1000 nm and not more than 5000 nm.

As shown in FIG. 2, a thickness t1 (the length along the first direction D1) of the first semiconductor region 11 is thicker than the thickness of the second semiconductor region 12 (the length L4 referring to FIG. 1) and thicker than the thickness of the third semiconductor region 13 (the length L3 referring to FIG. 1). The thickness t1 of the first semiconductor region 11 is, for example, not less than 5 μm and not more than 20 μm. For example, the first semiconductor region 11 corresponds to a drift layer.

A thickness t2 (the length along the first direction D1) of the base body 10s is, for example, not less than 300 μm and not more than 1000 μm (e.g., about 500 μm).

An example of the method for manufacturing the semiconductor device 110 according to the embodiment will now be described.

FIG. 3A to FIG. 3D and FIG. 4A to FIG. 4D are schematic cross-sectional views in order of the processes, illustrating the method for manufacturing the semiconductor device according to the first embodiment.

Figure 3A:
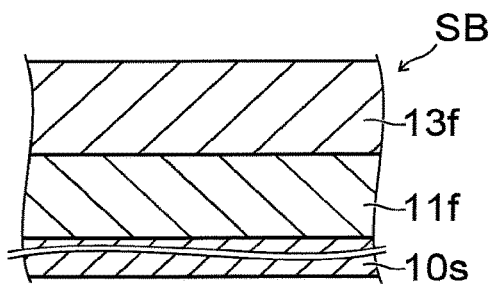
FIG. 3A to FIG. 3D are schematic cross-sectional views in order of the processes, illustrating the method for manufacturing the semiconductor device according to the first embodiment.

A stacked body SB is prepared as shown in FIG. 3A. The stacked body SB is provided on the base body 10s. The stacked body SB includes a first semiconductor film 11f and a third semiconductor film 13f. For example, the third semiconductor film 13f that includes $Al_{x3}Ga_{1-x3}N$ (0<x3<1 and x1<x3) is formed on the first semiconductor film 11f that includes $Al_1Ga_{1-x1}N$ (0≤x1<1). For example, these semiconductor films are formed by epitaxial growth. The first semiconductor film 11f includes the first impurity of the first conductivity type at the first concentration. The first semiconductor film 11f is used to form the first semiconductor region 11. The third semiconductor film 13f is used to form the third semiconductor region 13.

Figure 3B:
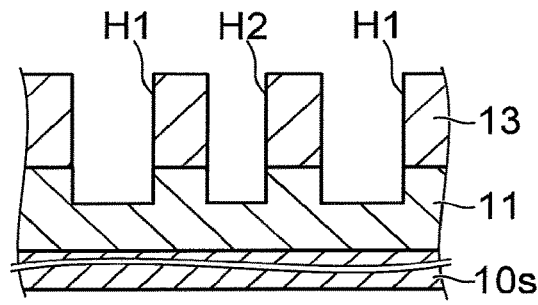

As shown in FIG. 3B, a first hole H1 and a second hole H2 are formed from the upper surface of the third semiconductor film 13f. These holes reach the first semiconductor film 11f. These holes may be, for example, trenches. By forming these holes, the first semiconductor region 11 is formed from the first semiconductor film 11f; and the third semiconductor region 13 is formed from the third semiconductor film 13f.

Figure 3C:
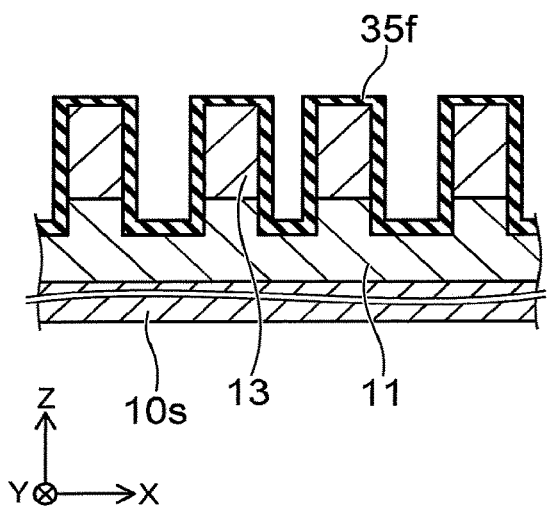

A first insulating film 35f is formed as shown in FIG. 3C. The first insulating film 35f is formed on the side surface and the bottom surface of each of the first hole H1 and the second hole H2. The first insulating film 35f is formed also on the upper surface of the third semiconductor region 13.

Figure 3D:
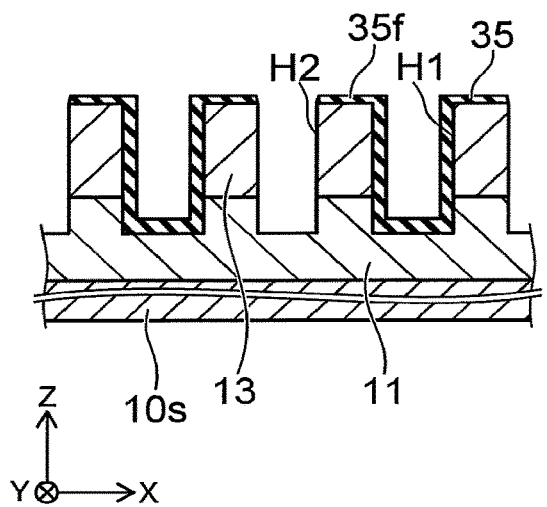

As shown in FIG. 3D, the portion of the first insulating film 35f positioned on the side surface and the bottom surface of the second hole H2 is removed. Thereby, the first insulating film 35f remains on the bottom surface and the side surface of the first hole H1. Thus, the first insulating film 35f is formed on the bottom surface and the side surface of the first hole H1.

Figure 4A:
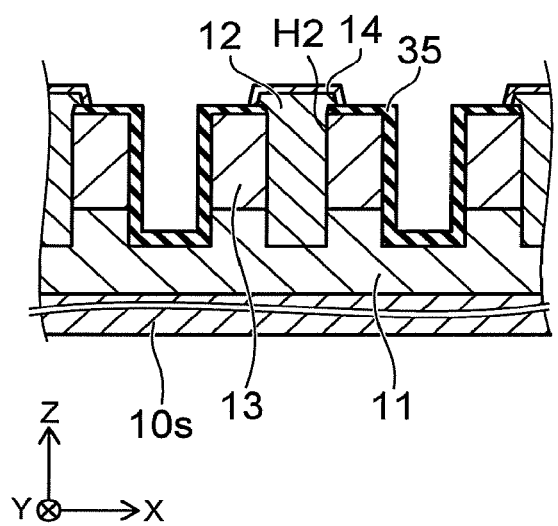
FIG. 4A to FIG. 4D are schematic cross-sectional views in order of the processes, illustrating the method for manufacturing the semiconductor device according to the first embodiment.

As shown in FIG. 4A, the second semiconductor region 12 is formed in the second hole H2. The second semiconductor region 12 includes $Al_{x2}Ga_{1-x2}N$ (0≤x2<1 and x2<x3). The second semiconductor region 12 does not include an impurity. Or, the second concentration of the first impurity in the second semiconductor region 12 is lower than the first concentration.

As shown in FIG. 4A, the fourth semiconductor region 14 is formed on the second semiconductor region 12. The fourth semiconductor region 14 includes $Al_{x4}Ga_{1-x4}N$ (0≤x4<1). The fourth concentration of the first impurity in the fourth semiconductor region 14 is higher than the second concentration. For example, the second semiconductor region 12 and the fourth semiconductor region 14 are formed by epitaxial growth.

Figure 4B:
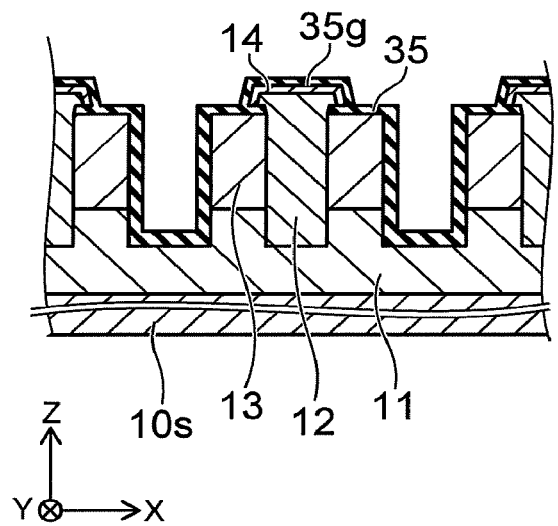

As shown in FIG. 4B, a second insulating film 35g is formed on the fourth semiconductor region 14. At least one of the first insulating film 35f or the second insulating film 35g is used to form the insulating portion 35.

Figure 4C:
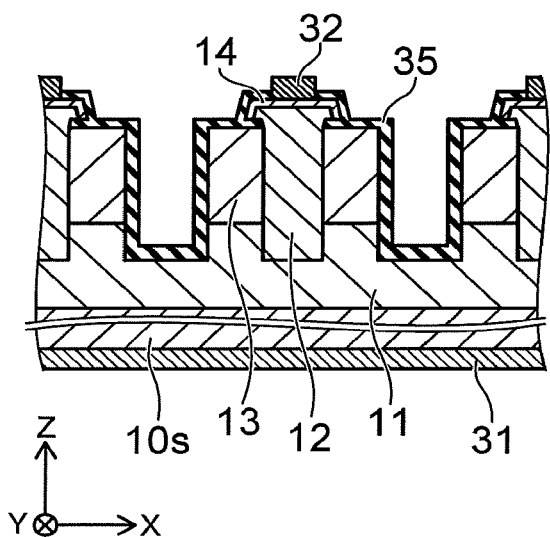

As shown in FIG. 4C, a portion of the second insulating film 35g is removed; and the fourth semiconductor region 14 is exposed. The second electrode 32 is formed on the exposed fourth semiconductor region 14. On the other hand, the first electrode 31 is formed on the lower surface (the back surface) of the base body 10s.

Figure 4D:
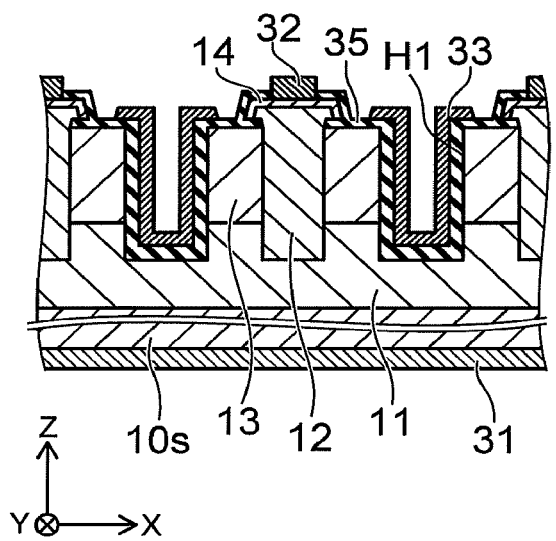

As shown in FIG. 4D, the third electrode 33 is formed in the remaining space of the first hole H1.

Thus, in the manufacturing method, the second electrode 32 that is electrically connected to the fourth semiconductor region 14, the third electrode 33 that is provided in the remaining space of the first hole H1, and the first electrode 31 that is electrically connected to the first semiconductor region 11 are formed. Thereby, the semiconductor device 110 is manufactured.

To form the semiconductor films or the semiconductor regions recited above, for example, crystal growth is performed using metal-organic chemical vapor deposition (MOCVD), molecular beam epitaxy (MBE), etc. To form the electrodes recited above, for example, a method such as sputtering, vapor deposition, atomic layer deposition (ALD), or the like is used. To form the insulating portions (the insulating films) recited above, for example, a method such as sputtering, plasma-enhanced CVD, low pressure CVD, ALD, or the like is used.

In the embodiment, the first electrode 31 includes, for example, at least one selected from the group consisting of Al, Ti, Ni, and Au. The second electrode 32 includes, for example, at least one selected from the group consisting of Al, Ti, Ni, and Au. The third electrode 33 includes, for example, at least one selected from the group consisting of Al, Ni, Au, TiN, WN, and polysilicon.

The insulating portion 35 includes at least one selected from the group consisting of silicon oxide, silicon nitride, silicon oxynitride, metal oxide, metal nitride, and metal oxynitride.

An example of a characteristic of the semiconductor device will now be described.

Figure 5:
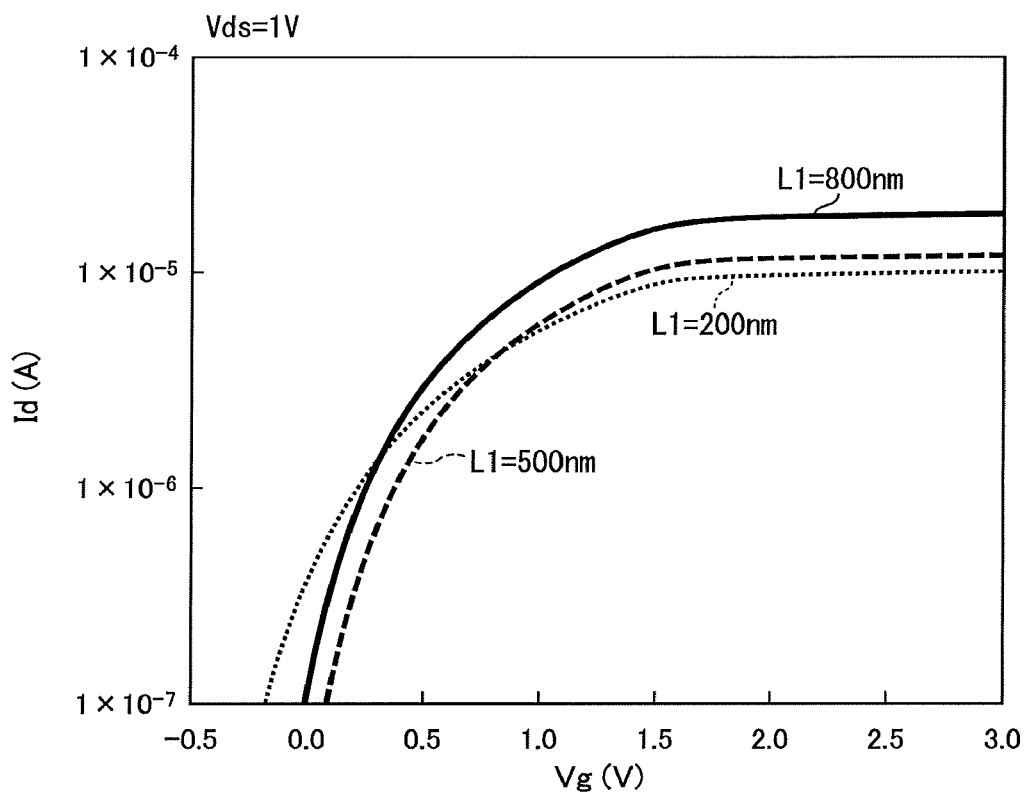
FIG. 5 is a graph illustrating a characteristic of the semiconductor device according to the first embodiment.

FIG. 5 is a graph illustrating a characteristic of the semiconductor device according to the first embodiment.

FIG. 5 shows simulation results of the drain current when the length L1 along the second direction D2 of the second semiconductor region 12 (referring to FIG. 1) is changed. The length L1 corresponds to, for example, the channel width. In the model of the simulation, the first semiconductor region 11 is $n^-$-GaN. The second semiconductor region 12 is i-GaN. The third semiconductor region 13 is $Al_{0.2}Ga_{0.8}N$. The fourth semiconductor region 14 is $n^+$-GaN. The sum of the length L1 and 2 times the length L2 (the distance between two of the third electrodes 33 referring to FIG. 1) is 1.5 μm and is constant. The voltage (Vds) that is applied between the first electrode 31 and the second electrode 32 is 1 V. The horizontal axis of FIG. 5 is a gate voltage Vg (V). The vertical axis is a drain current Id (A).

As shown in FIG. 5, when the length L1 is 200 nm, the drain current Id is large when the gate voltage Vg is 0 V or less. On the other hand, when the length L1 is 500 nm or 800 nm, the drain current Id is small when the gate voltage Vg is 0 V or less. Good off-characteristics are obtained when the length L1 is 500 nm or more. Also, the saturation value (the current in the on-state) of the drain current Id increases as the length L1 lengthens.

In the embodiment, it is favorable for the length L1 to be 500 nm or more. Thereby, a good normally-off characteristic is obtained. A large drain current Id is obtained in the on-state. A low on-resistance is obtained.

In the embodiment, the length L1 is, for example, 5000 nm or less.

Thus, in the embodiment, a normally-off operation is obtained. The following state is obtained in the normally-off operation. The current that flows between the second electrode 32 and the first electrode 31 when the potential difference between the second electrode 32 and the third electrode 33 is a first potential difference (e.g., when 0 V) is taken as a first current. The current that flows between the second electrode 32 and the first electrode 31 when the potential difference between the second electrode 32 and the third electrode 33 is a second potential difference (when a high voltage) is taken as a second current. The first current is smaller than the second current. The absolute value of the first potential difference is less than the absolute value of the second potential difference. For example, when the first potential difference is 0 V and the second potential difference is 2 V, the first current is not more than $\frac{1}{100}$ of the second current.

Figure 6:
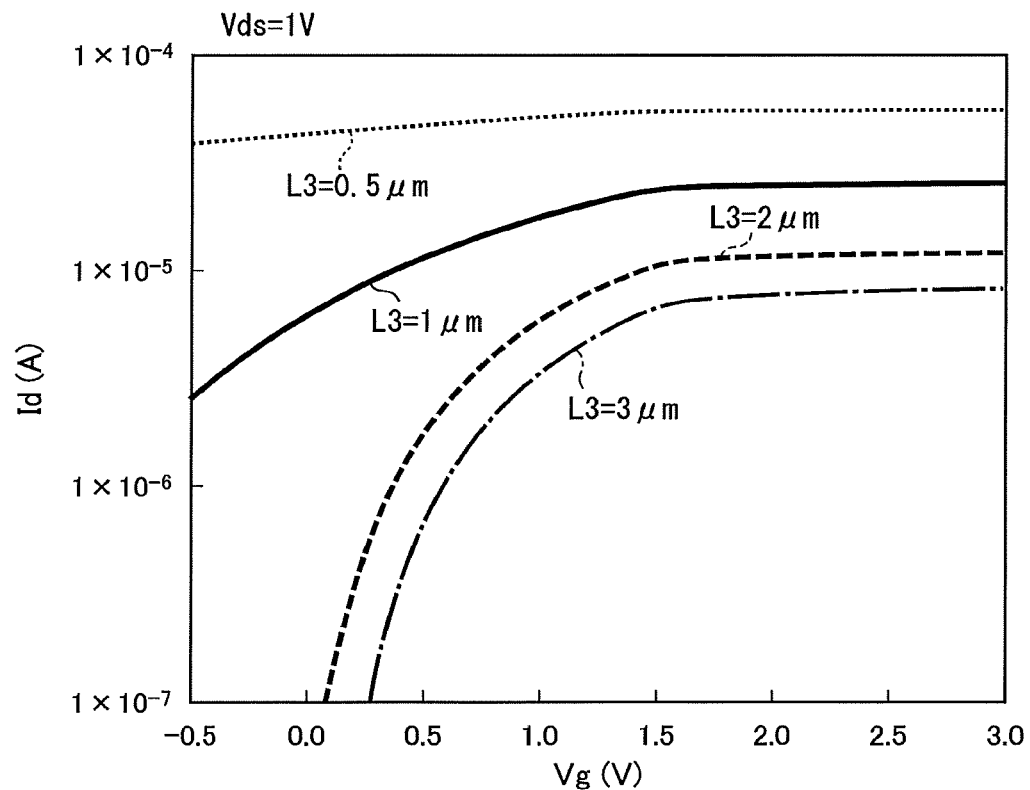
FIG. 6 is a graph illustrating a characteristic of the semiconductor device according to the first embodiment.

FIG. 6 is a graph illustrating a characteristic of the semiconductor device according to the first embodiment.

FIG. 6 shows simulation results of the drain current when the length L3 along the first direction D1 of the third semiconductor region 13 (referring to FIG. 1) is changed. The length L3 corresponds to, for example, the channel length. In the model of the simulation, the first semiconductor region 11 is $n^-$-GaN. The second semiconductor region 12 is i-GaN. The third semiconductor region 13 is $Al_{0.2}Ga_{0.8}N$. The fourth semiconductor region 14 is $n^+$-GaN. The length L1 is 500 nm. The length L2 is 500 nm. The voltage (Vds) that is applied between the first electrode 31 and the second electrode 32 is 1 V. The horizontal axis of FIG. 6 is the gate voltage Vg (V). The vertical axis is the drain current Id (A).

As shown in FIG. 6, in the case where the length L3 is short, the drain current Id is large and a leaky characteristic occurs when the gate voltage Vg is 0 V or less. On the other hand, in the case where the length L3 is excessively long, the saturation value (the current in the on-state) of the drain current Id is small. The on-resistance increases.

In the embodiment, it is favorable for the length L3 to be, for example, not less than 1000 nm and not more than 5000 nm. It is more favorable for the length L3 to be, for example, 2000 nm or more. By setting the length L3 to be long, the drain current Id can be small in the off-state. A large on-off ratio is obtained. In the case where the length L3 is 5000 nm or less, for example, the decrease of the saturation current density is suppressed; and a low on-resistance is obtained. In the case where the length L3 is excessively long, for example, the crystallinity of the third semiconductor region 13 is low. In the case where the length L3 is 5000 nm or less, good crystallinity is obtained. Thereby, for example, a low on-resistance is obtained.

In the embodiment, it is favorable for the length L2 along the second direction D2 of the third semiconductor region 13 to be, for example, 1000 nm or less. In the case where the length L2 is excessively long, the integration of the semiconductor device (e.g., the distance between the multiple third electrodes 33 when the multiple third electrodes 33 are provided) cannot be small. In the case where the length L2 is excessively long, the response characteristics degrade. In the case where the length L2 is 1000 nm or less, high integration and good response characteristics are obtained.

On the other hand, in the case where the length L2 is excessively short, for example, the distortion of the crystal of the third semiconductor region 13 (AlGaN) is relaxed; and the back barrier effect is small. The length L2 is, for example, 200 nm or more.

Other examples of the semiconductor device according to the embodiment will now be described.

Figure 7A:
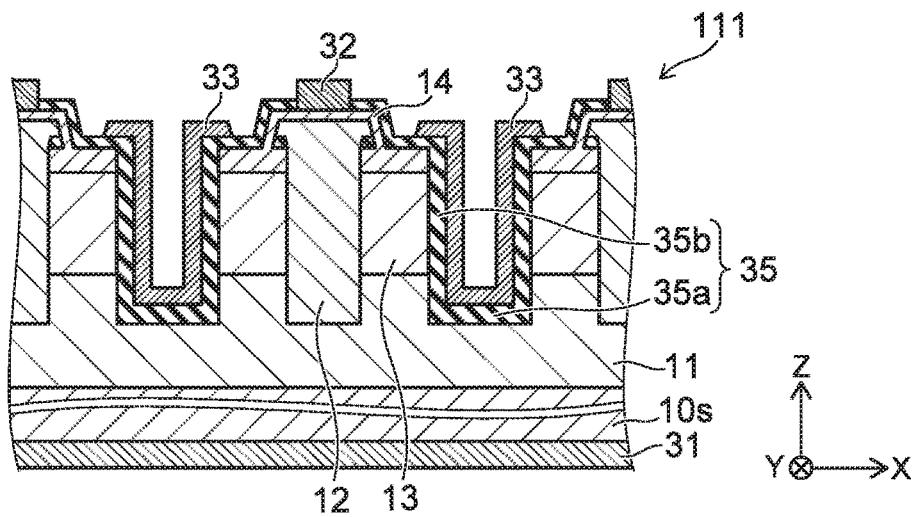
FIG. 7A to FIG. 7C are schematic cross-sectional views illustrating other semiconductor devices according to the first embodiment.
Figure 7B:
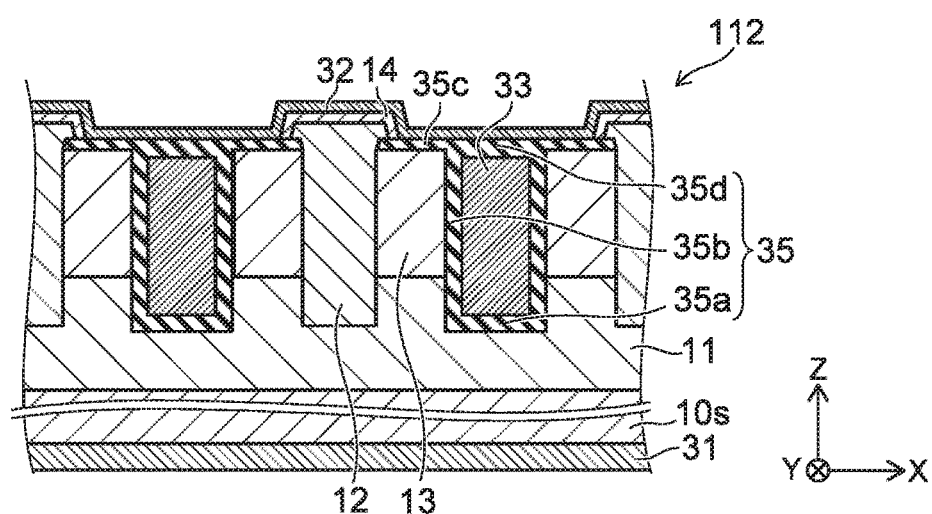
Figure 7C:
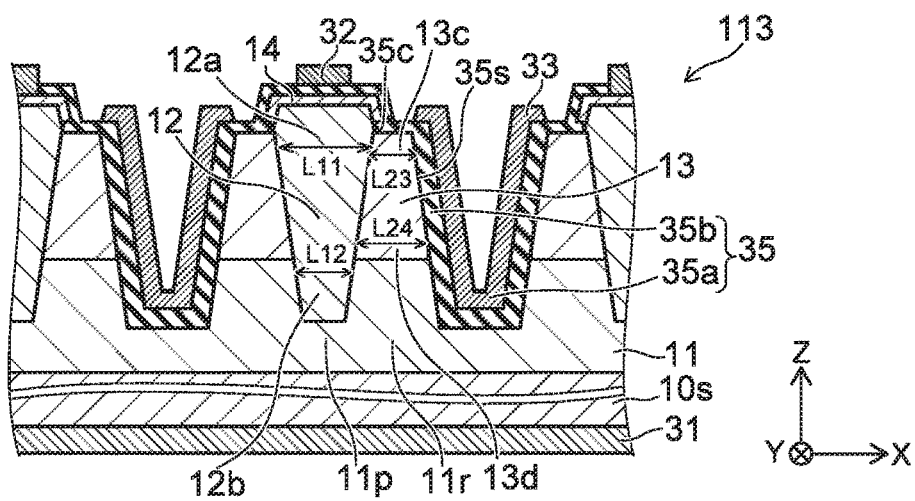

FIG. 7A to FIG. 7C are schematic cross-sectional views illustrating other semiconductor devices according to the first embodiment.

In a semiconductor device 111 according to the embodiment as shown in FIG. 7A, the configuration of the fourth semiconductor region 14 is different from the configuration of the fourth semiconductor region 14 of the semiconductor device 110. Otherwise, the configuration of the semiconductor device 111 is similar to that of the semiconductor device 110.

In the semiconductor device 111, a portion of the fourth semiconductor region 14 overlaps the third semiconductor region 13 in the Z-axis direction. For example, the direction from a portion of the third semiconductor region 13 toward a portion of the fourth semiconductor region 14 is aligned with the first direction D1 (the Z-axis direction). The portion of the third semiconductor region 13 is electrically connected to the portion of the fourth semiconductor region 14.

In the semiconductor device 111, for example, a channel that includes the interface between the second electrode 32 (e.g., the source electrode) and the fourth semiconductor region 14 (e.g., the n$^+$-GaN contact layer) and the interface between the third semiconductor region 13 (e.g., the AlGaN layer) and the second semiconductor region 12 (e.g., GaN) is continuous. Electrons flow through the continuous channel. Therefore, the on-resistance is reduced.

In a semiconductor device 112 according to the embodiment as shown in FIG. 7B, the third electrode 33 is surrounded with the insulating portion 35. A portion of the second electrode 32 is provided on the third electrode 33 with the insulating portion 35 interposed. Otherwise, the configuration of the semiconductor device 112 is similar to that of the semiconductor device 110.

In the semiconductor device 112, the insulating portion 35 further includes a fourth insulating region 35d. The fourth insulating region 35d is positioned between the third electrode 33 and a portion of the second electrode 32 in the first direction D1 (the Z-axis direction).

In the semiconductor device 112, for example, high-precision patterning is unnecessary to form the second electrode 32 (e.g., the source electrode). Thereby, for example, it is easy to increase integration. For example, the flatness of the semiconductor device improves. Thereby, the degrees of freedom of the mounting of the semiconductor device increase.

In a semiconductor device 113 according to the embodiment as shown in FIG. 7C, the third electrode 33 and the second insulating region 35b are tilted with respect to the Z-axis direction. Otherwise, the configuration of the semiconductor device 113 is similar to that of the semiconductor device 110.

In the semiconductor device 113, the second insulating region 35b has a side surface 35s opposing the third semiconductor region 13. The side surface 35s is tilted with respect to the first direction D1 (the Z-axis direction). The angle between the side surface 35s and the Z-axis direction is, for example, not less than 50 degrees but less than 90 degrees.

Such a tilt is formed in the case where the side surfaces of the first hole H1 and the second hole H2 (referring to FIG. 3B) have tapered configurations.

For example, the second semiconductor region 12 includes a first partial region 12a and a second partial region 12b. The second partial region 12b is positioned between the first partial region 12a and the first semiconductor portion 11p in the first direction D1 (the Z-axis direction). A length L11 along the second direction D2 (the X-axis direction) of the first partial region 12a is longer than a length L12 along the second direction of the second partial region 12b.

For example, the third semiconductor region 13 includes a third partial region 13c and a fourth partial region 13d. The fourth partial region 13d is positioned between the third partial region 13c and the third semiconductor portion 11r in the first direction D1 (the Z-axis direction). A length L23 along the second direction D2 (the X-axis direction) of the third partial region 13c is shorter than a length L24 along the second direction D2 of the fourth partial region 13d.

In the semiconductor device 113, for example, electrical connection defects of the third electrode 33 (e.g., the gate electrode) or the insulating portion 35 (e.g., the gate insulating film) are suppressed. For example, stable characteristics are obtained easily. For example, a high yield is obtained.

Figure 8A:
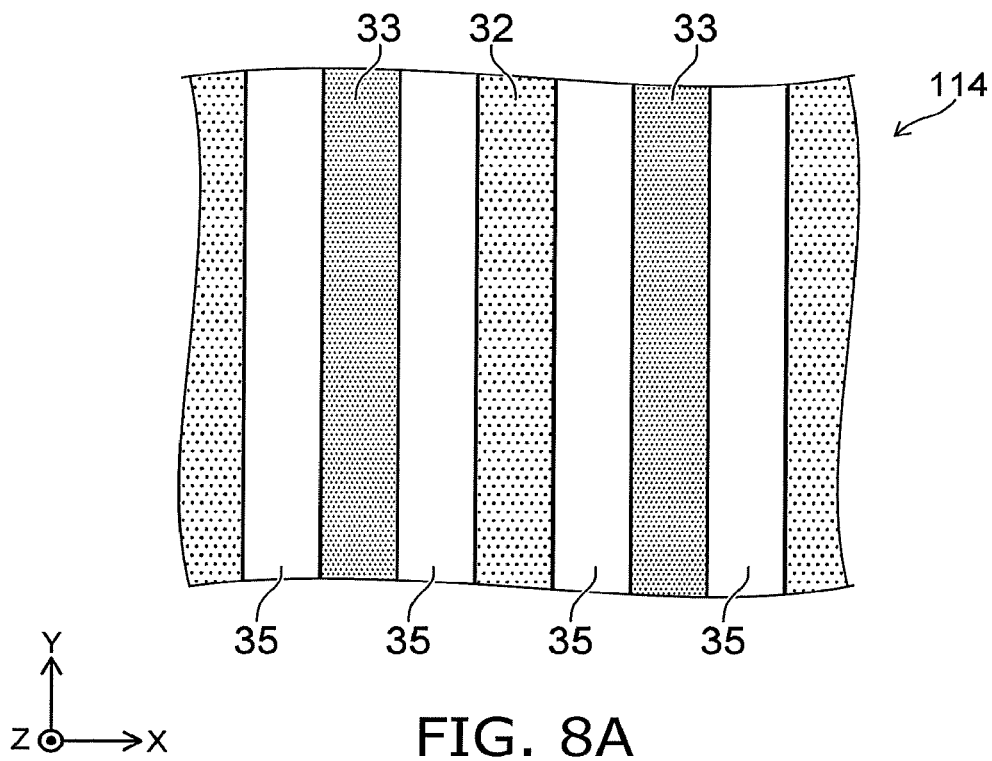
FIG. 8A and FIG. 8B are schematic plan views illustrating semiconductor devices according to the first embodiment.
Figure 8B:
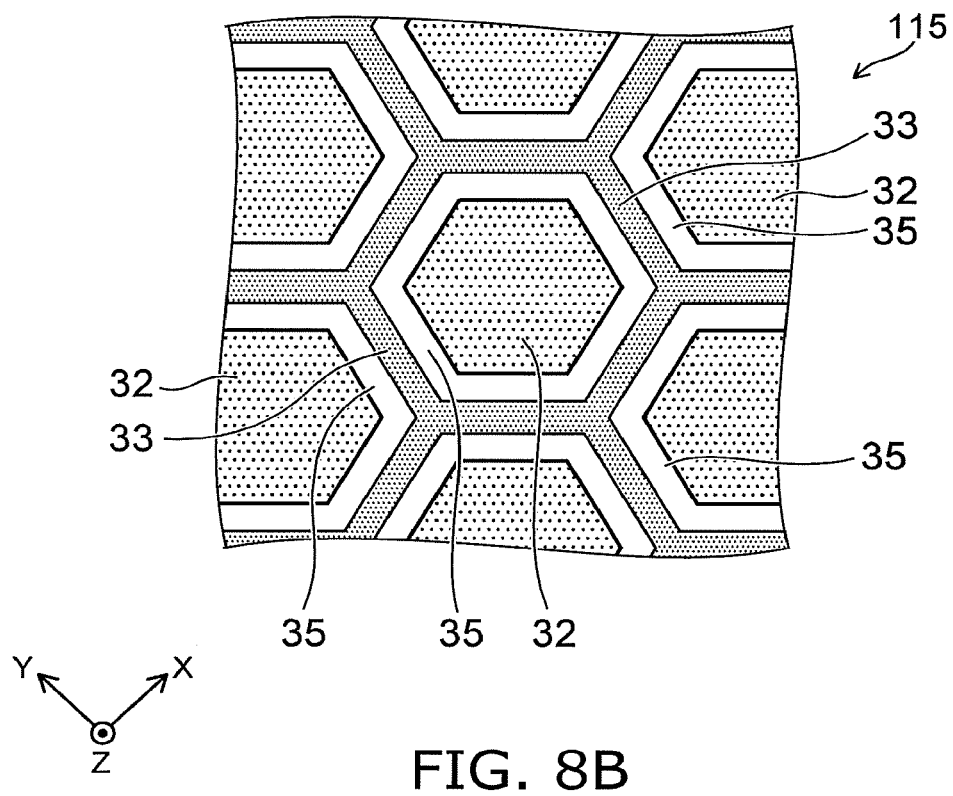

FIG. 8A and FIG. 8B are schematic plan views illustrating semiconductor devices according to the first embodiment.

These drawings are plan views when viewed along arrow AR of FIG. 1.

In one example (the semiconductor device 114) according to the embodiment as shown in FIG. 8A, the second electrode 32 and the third electrode 33 have stripe configurations extending in one direction.

In one other example (the semiconductor device 115) according to the embodiment as shown in FIG. 8B, the second electrode 32 and the third electrode 33 have a hexagonal configuration pattern.

In the embodiment, various modifications are possible for the pattern of the second electrode 32 and the third electrode 33.

Second Embodiment

The embodiment relates to a method for manufacturing the semiconductor device. In the manufacturing method, for example, the processing described in reference to FIG. 3A to FIG. 3D and FIG. 4A to FIG. 4D is performed.

For example, as described above, the stacked body SB that includes the first semiconductor film 11f and includes the third semiconductor film 13f provided on the first semiconductor film 11f is prepared. The first semiconductor film 11f includes $Al_{x1}Ga_{1-x1}N$ (0≤x1<1). The third semiconductor film 13f includes $Al_{x3}Ga_{1-x3}N$ (0<x3<1 and x1<x3). The first semiconductor film 11f has the first concentration of the first impurity of the first conductivity type.

By forming the first hole and the second hole from the upper surface of the third semiconductor film 13f to reach the first semiconductor film 11f, the first semiconductor region 11 is formed from the first semiconductor film 11f, and the third semiconductor region 13 is formed from the third semiconductor film 13f. The first insulating film 35f is formed on the bottom surface and the side surface of the first hole H1.

The second semiconductor region 12 that includes $Al_{x2}Ga_{1-x2}N$ (0≤x2<1 and x2<x3) is formed in the second hole H2. The second semiconductor region 12 does not include an impurity. Or, the second concentration of the first impurity in the second semiconductor region 12 is lower than the first concentration.

The fourth semiconductor region 14 that includes $Al_{x4}Ga_{1-x4}N$ (0≤x4<1) is formed on the second semiconductor region 12. The fourth concentration of the first impurity in the fourth semiconductor region 14 is higher than the second concentration. Subsequently, the first electrode 31, the second electrode 32, and the third electrode 33 are formed. According to the manufacturing method, a semiconductor device in which it is possible to reduce the on-resistance can be manufactured by a simple process.

The embodiments may include the following configurations (e.g., technological proposals).

Configuration 1

A semiconductor device, comprising:

a first electrode including a first electrode portion and a second electrode portion;

a second electrode, a first direction from the first electrode portion toward the second electrode crossing a second direction from the first electrode portion toward the second electrode portion;

a third electrode, a direction from the second electrode portion toward the third electrode being along the first direction;

a first semiconductor region including a first semiconductor portion, a second semiconductor portion, and a third semiconductor portion, the first semiconductor portion being provided between the first electrode portion and the second electrode in the first direction, the second semiconductor portion being provided between the second electrode portion and the third electrode in the first direction, the third semiconductor portion being provided between the first semiconductor portion and the second semiconductor portion in the second direction, the first semiconductor region including $Al_{x1}Ga_{1-x1}N$ (0≤x1<1), the first semiconductor region including a first impurity of a first conductivity type at a first concentration;

a second semiconductor region including $Al_{x2}Ga_{1-x2}N$ (0≤x2<1) and being provided between the first semiconductor portion and the second electrode in the first direction, the second semiconductor region not including the first impurity, or a second concentration of the first impurity in the second semiconductor region being lower than the first concentration;

a third semiconductor region including $Al_{x3}Ga_{1-x3}N$ (0<x3<1, x1<x3, and x2<x3), a direction from the third semiconductor portion toward the third semiconductor region being aligned with the first direction, the third semiconductor region being positioned between the second semiconductor region and the third electrode in the second direction;

an insulating portion including a first insulating region and a second insulating region, the first insulating region being positioned between the second semiconductor portion and the third electrode in the first direction, the second insulating region being positioned between the third semiconductor region and the third electrode in the second direction; and a fourth semiconductor region, at least a portion of the fourth semiconductor region being provided between the second semiconductor region and the second electrode, the fourth semiconductor region including $Al_{x4}Ga_{1-x4}N$ (0≤x4<1), a fourth concentration of the first impurity in the fourth semiconductor region being higher than the second concentration.

Configuration 2

The semiconductor device according to Configuration 1, wherein an impurity concentration of the second semiconductor region is $2 \times 10^{16}$ cm$^{-3}$ or less.

Configuration 3

The semiconductor device according to Configuration 1 or 2, wherein the first insulating region contacts the second semiconductor portion.

Configuration 4

The semiconductor device according to any one of Configurations 1 to 3, wherein the first direction is aligned with the c-axis of the first semiconductor region.

Configuration 5

The semiconductor device according to any one of Configurations 1 to 4, wherein the second direction is aligned with the a-axis or the m-axis of the first semiconductor region.

Configuration 6

The semiconductor device according to any one of Configurations 1 to 5, wherein a portion of the first semiconductor region is positioned between the second semiconductor region and the third electrode in the second direction.

Configuration 7

The semiconductor device according to any one of Configurations 1 to 6, wherein a first distance along the first direction between the first electrode portion and the second semiconductor region is shorter than a third distance along the first direction between the second electrode portion and the third electrode.

Configuration 8

The semiconductor device according to any one of Configurations 1 to 6, wherein a ratio of the absolute value of a difference between a first distance and a second distance to the first distance is 0.05 or less, the first distance being along the first direction between the first electrode portion and the second semiconductor region, the second distance being along the first direction between the first insulating region and the second electrode portion.

Configuration 9

The semiconductor device according to any one of Configurations 1 to 8, wherein the insulating portion further includes a third insulating region, and the third insulating region is positioned between the fourth semiconductor region and the third semiconductor region in the first direction.

Configuration 10

The semiconductor device according to any one of Configurations 1 to 9, wherein a direction from a portion of the third semiconductor region toward a portion of the fourth semiconductor region is aligned with the first direction, and the portion of the third semiconductor region is electrically connected to the portion of the fourth semiconductor region.

Configuration 11

The semiconductor device according to any one of Configurations 1 to 10, wherein the insulating portion further includes a fourth insulating region, and the fourth insulating region is positioned between the third electrode and a portion of the second electrode in the first direction.

Configuration 12

The semiconductor device according to any one of Configurations 1 to 11, wherein the second insulating region has a side surface opposing the third semiconductor region, and the side surface is tilted with respect to the first direction.

Configuration 13

The semiconductor device according to any one of Configurations 1 to 12, wherein the second semiconductor region includes a first partial region and a second partial region, the second partial region is positioned between the first partial region and the first semiconductor portion in the first direction, and a length along the second direction of the first partial region is longer than a length along the second direction of the second partial region.

Configuration 14

The semiconductor device according to any one of Configurations 1 to 13, wherein the third semiconductor region includes a third partial region and a fourth partial region, the fourth partial region is positioned between the third partial region and the third semiconductor portion in the first direction, and a length along the second direction of the third partial region is shorter than a length along the second direction of the fourth partial region.

Configuration 15

The semiconductor device according to any one of Configurations 1 to 14, wherein a length along the second direction of the second semiconductor region is 500 nm or more.

Configuration 16

The semiconductor device according to any one of Configurations 1 to 15, wherein a length along the second direction of the third semiconductor region is 1000 nm or less.

Configuration 17

The semiconductor device according to any one of Configurations 1 to 16, wherein a length along the first direction of the third semiconductor region is not less than 1000 nm and not more than 5000 nm.

Configuration 18

The semiconductor device according to any one of Configurations 1 to 17, wherein a first current is smaller than a second current, the first current flowing between the second electrode and the first electrode when a potential difference between the second electrode and the third electrode is a first potential difference, the second current flowing between the second electrode and the first electrode when the potential difference between the second electrode and the third electrode is a second potential difference, the absolute value of the first potential difference being less than the absolute value of the second potential difference.

Configuration 19

The semiconductor device according to any one of Configurations 1 to 17, wherein the second semiconductor region includes GaN.

Configuration 20

A method for manufacturing a semiconductor device, comprising:

preparing a stacked body including a first semiconductor film and a third semiconductor film, the third semiconductor film being provided on the first semiconductor film, the first semiconductor film including $Al_{x1}Ga_{1-x1}N$ ($0 \leq x1 < 1$), the third semiconductor film including $Al_{x3}Ga_{1-x3}N$ ($0 < x3 < 1$ and $x1 < x3$), the first semiconductor film including a first concentration of a first impurity of a first conductivity type;

forming a first semiconductor region from the first semiconductor film and forming a third semiconductor region from the third semiconductor film by forming a first hole and a second hole reaching the first semiconductor film from an upper surface of the third semiconductor film;

forming a first insulating film on a bottom surface and a side surface of the first hole;

forming a second semiconductor region in the second hole, the second semiconductor region including $Al_{x2}Ga_{1-x2}N$ ($0 \leq x2 < 1$ and $x2 < x3$), the second semiconductor region not including an impurity, or a second concentration of the first impurity in the second semiconductor region being lower than the first concentration;

forming a fourth semiconductor region on the second semiconductor region, the fourth semiconductor region including $Al_{x4}Ga_{1-x4}N$ ($0 \leq x4 < 1$), a fourth concentration of the first impurity in the fourth semiconductor region being higher than the second concentration; and forming a second electrode, a third electrode, and a first electrode, the second electrode being electrically connected to the fourth semiconductor region, the third electrode being provided in a remaining space of the first hole, the first electrode being electrically connected to the first semiconductor region.

According to the embodiments, a semiconductor device and a method for manufacturing the semiconductor device can be provided in which it is possible to reduce the on-resistance.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, base bodies, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing the same practicable by an appropriate design modification by one skilled in the art based on the semiconductor devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode including a first electrode portion and a second electrode portion;
   a second electrode, a first direction from the first electrode portion toward the second electrode crossing a second direction from the first electrode portion toward the second electrode portion;
   a third electrode, a direction from the second electrode portion toward the third electrode being along the first direction;
   a first semiconductor region including a first semiconductor portion, a second semiconductor portion, and a third semiconductor portion, the first semiconductor portion being provided between the first electrode portion and the second electrode in the first direction, the second semiconductor portion being provided between the second electrode portion and the third electrode in the first direction, the third semiconductor portion being provided between the first semiconductor portion and the second semiconductor portion in the second direction, the first semiconductor region including $Al_{x1}Ga_{1-x1}N$ ($0 \leq x1 < 1$), the first semiconductor region including a first impurity of a first conductivity type at a first concentration;
   a second semiconductor region including $Al_{x2}Ga_{1-x2}N$ ($0 \leq x2 < 1$) and being provided between the first semiconductor portion and the second electrode in the first direction, the second semiconductor region not including the first impurity, or a second concentration of the first impurity in the second semiconductor region being lower than the first concentration;
   a third semiconductor region including $Al_{x3}Ga_{1-x3}N$ ($0 < x3 < 1$, $x1 < x3$, and $x2 < x3$), a direction from the third semiconductor portion toward the third semiconductor region being aligned with the first direction, the third semiconductor region being positioned between the second semiconductor region and the third electrode in the second direction;
   an insulating portion including a first insulating region and a second insulating region, the first insulating region being positioned between the second semiconductor portion and the third electrode in the first direction, the second insulating region being positioned between the third semiconductor region and the third electrode in the second direction; and
   a fourth semiconductor region, at least a portion of the fourth semiconductor region being provided between the second semiconductor region and the second electrode, the fourth semiconductor region including $Al_{x4}Ga_{1-x4}N$ ($0 \leq x4 < 1$), a fourth concentration of the first impurity in the fourth semiconductor region being higher than the second concentration, wherein
   a length along the first direction of the third semiconductor region is shorter than a length along the first direction of the second semiconductor region, and
   a portion of the first semiconductor region is positioned between the second semiconductor region and the third electrode in the second direction.

2. The device according to claim 1, wherein an impurity concentration of the second semiconductor region is $2 \times 10^{16}$ $cm^{-3}$ or less.

3. The device according to claim 1, wherein the first insulating region contacts the second semiconductor portion.

4. The device according to claim 1, wherein the first direction is aligned with a c-axis of the first semiconductor region.

5. The device according to claim 1, wherein the second direction is aligned with an a-axis or a m-axis of the first semiconductor region.

6. The device according to claim 1, wherein a first distance along the first direction between the first electrode portion and the second semiconductor region is shorter than a third distance along the first direction between the second electrode portion and the third electrode.

7. The device according to claim 1, wherein a ratio of the absolute value of a difference between a first distance and a second distance to the first distance is 0.05 or less, the first distance being along the first direction between the first electrode portion and the second semiconductor region, the second distance being along the first direction between the first insulating region and the second electrode portion.

8. The device according to claim 1, wherein
   the insulating portion further includes a third insulating region, and
   the third insulating region is positioned between the fourth semiconductor region and the third semiconductor region in the first direction.

9. The device according to claim 1, wherein
   a direction from a portion of the third semiconductor region toward a portion of the fourth semiconductor region is aligned with the first direction, and
   the portion of the third semiconductor region is electrically connected to the portion of the fourth semiconductor region.

10. The device according to claim 1, wherein
    the insulating portion further includes a fourth insulating region, and
    the fourth insulating region is positioned between the third electrode and a portion of the second electrode in the first direction.

11. The device according to claim 1, wherein
the second insulating region has a side surface opposing the third semiconductor region, and
the side surface is tilted with respect to the first direction.

12. The device according to claim 1, wherein
the second semiconductor region includes a first partial region and a second partial region,
the second partial region is positioned between the first partial region and the first semiconductor portion in the first direction, and
a length along the second direction of the first partial region is longer than a length along the second direction of the second partial region.

13. The device according to claim 1, wherein
the third semiconductor region includes a third partial region and a fourth partial region,
the fourth partial region is positioned between the third partial region and the third semiconductor portion in the first direction, and
a length along the second direction of the third partial region is shorter than a length along the second direction of the fourth partial region.

14. The device according to claim 1, wherein a length along the second direction of the second semiconductor region is 500 nm or more.

15. The device according to claim 1, wherein a length along the second direction of the third semiconductor region is 1000 nm or less.

16. The device according to claim 1, wherein the length along the first direction of the third semiconductor region is not less than 1000 nm and not more than 5000 nm.

17. The device according to claim 1, wherein a first current is smaller than a second current, the first current flowing between the second electrode and the first electrode when a potential difference between the second electrode and the third electrode is a first potential difference, the second current flowing between the second electrode and the first electrode when the potential difference between the second electrode and the third electrode is a second potential difference, the absolute value of the first potential difference being less than the absolute value of the second potential difference.

18. The device according to claim 1, wherein the second semiconductor region includes GaN.

19. A semiconductor device, comprising:
a first electrode including a first electrode portion and a second electrode portion;
a second electrode, a first direction from the first electrode portion toward the second electrode crossing a second direction from the first electrode portion toward the second electrode portion;
a third electrode, a direction from the second electrode portion toward the third electrode being along the first direction;
a first semiconductor region including a first semiconductor portion, a second semiconductor portion, and a third semiconductor portion, the first semiconductor portion being provided between the first electrode portion and the second electrode in the first direction, the second semiconductor portion being provided between the second electrode portion and the third electrode in the first direction, the third semiconductor portion being provided between the first semiconductor portion and the second semiconductor portion in the second direction, the first semiconductor region including $Al_{x1}Ga_{1-x1}N$ ($0 \leq x1 < 1$), the first semiconductor region including a first impurity of a first conductivity type at a first concentration;
a second semiconductor region including $Al_{x2}Ga_{1-x2}N$ ($0 \leq x2 < 1$) and being provided between the first semiconductor portion and the second electrode in the first direction, the second semiconductor region not including the first impurity, or a second concentration of the first impurity in the second semiconductor region being lower than the first concentration;
a third semiconductor region including $Al_{x3}Ga_{1-x3}N$ ($0 < x3 < 1$, $x1 < x3$, and $x2 < x3$), a direction from the third semiconductor portion toward the third semiconductor region being aligned with the first direction, the third semiconductor region being positioned between the second semiconductor region and the third electrode in the second direction;
an insulating portion including a first insulating region and a second insulating region, the first insulating region being positioned between the second semiconductor portion and the third electrode in the first direction, the second insulating region being positioned between the third semiconductor region and the third electrode in the second direction; and
a fourth semiconductor region, at least a portion of the fourth semiconductor region being provided between the second semiconductor region and the second electrode, the fourth semiconductor region including $Al_{x4}Ga_{1-x4}N$ ($0 \leq x4 < 1$), a fourth concentration of the first impurity in the fourth semiconductor region being higher than the second concentration, wherein
the first electrode includes a face opposing the first semiconductor region, the second direction being parallel to the face, and
a portion of the first semiconductor region is positioned between the second semiconductor region and the third electrode in the second direction.

20. A semiconductor device, comprising:
a first electrode including a first electrode portion and a second electrode portion;
a second electrode, a first direction from the first electrode portion toward the second electrode crossing a second direction from the first electrode portion toward the second electrode portion;
a third electrode, a direction from the second electrode portion toward the third electrode being along the first direction;
a first semiconductor region including a first semiconductor portion, a second semiconductor portion, and a third semiconductor portion, the first semiconductor portion being provided between the first electrode portion and the second electrode in the first direction, the second semiconductor portion being provided between the second electrode portion and the third electrode in the first direction, the third semiconductor portion being provided between the first semiconductor portion and the second semiconductor portion in the second direction, the first semiconductor region including $Al_{x1}Ga_{1-x1}N$ ($0 \leq x1 < 1$), the first semiconductor region including a first impurity of a first conductivity type at a first concentration;
a second semiconductor region including $Al_{x2}Ga_{1-x2}N$ ($0 \leq x2 < 1$) and being provided between the first semiconductor portion and the second electrode in the first direction, the second semiconductor region not including the first impurity, or a second concentration of the first impurity in the second semiconductor region being lower than the first concentration;

a third semiconductor region including $Al_{x3}Ga_{1-x3}N$ ($0<x3<1$, $x1<x3$, and $x2<x3$), a direction from the third semiconductor portion toward the third semiconductor region being aligned with the first direction, the third semiconductor region being positioned between the second semiconductor region and the third electrode in the second direction;

an insulating portion including a first insulating region and a second insulating region, the first insulating region being positioned between the second semiconductor portion and the third electrode in the first direction, the second insulating region being positioned between the third semiconductor region and the third electrode in the second direction; and a fourth semiconductor region, at least a portion of the fourth semiconductor region being provided between the second semiconductor region and the second electrode, the fourth semiconductor region including $Al_{x4}Ga_{1-x4}N$ ($0 \leq x4 < 1$), a fourth concentration of the first impurity in the fourth semiconductor region being higher than the second concentration, wherein the first insulating region directly contacts the second semiconductor portion.

* * * * *